(12) United States Patent
Zhu et al.

(10) Patent No.: US 10,784,821 B2
(45) Date of Patent: Sep. 22, 2020

(54) HIGH POWER RADIO FREQUENCY AMPLIFIERS AND METHODS OF MANUFACTURE THEREOF

(71) Applicant: NXP USA, INC., Austin, TX (US)

(72) Inventors: Ning Zhu, Chandler, AZ (US); Jeffrey Spencer Roberts, Tempe, AZ (US); Damon G. Holmes, Scottsdale, AZ (US)

(73) Assignee: NXP USA, Inc., Austin, TX (US)

( * ) Notice: Subject to any disclaimer, the term of this patent is extended or adjusted under 35 U.S.C. 154(b) by 14 days.

(21) Appl. No.: 16/226,012

(22) Filed: Dec. 19, 2018

(65) Prior Publication Data

US 2020/0204121 A1    Jun. 25, 2020

(51) Int. Cl.
| | |
|---|---|
| *H03F 1/56* | (2006.01) |
| *H01L 29/778* | (2006.01) |
| *H01L 29/20* | (2006.01) |
| *H01L 23/66* | (2006.01) |
| *H01L 23/495* | (2006.01) |
| *H01L 21/48* | (2006.01) |
| *H01L 23/00* | (2006.01) |

(Continued)

(52) U.S. Cl.
CPC ......... *H03F 1/565* (2013.01); *H01L 21/4825* (2013.01); *H01L 23/4952* (2013.01); *H01L 23/49562* (2013.01); *H01L 23/49568* (2013.01); *H01L 23/66* (2013.01); *H01L 24/48* (2013.01); *H01L 24/49* (2013.01); *H01L 29/2003* (2013.01); *H01L 29/7787* (2013.01); *H03F 3/193* (2013.01); *H03F 3/2171* (2013.01); *H01L 2223/6611* (2013.01); *H01L 2223/6655* (2013.01); *H01L 2223/6666* (2013.01); *H01L 2223/6672* (2013.01); *H01L 2224/48091* (2013.01); *H01L 2224/49052* (2013.01); *H01L 2924/19041* (2013.01); *H01L 2924/19042* (2013.01); *H01L 2924/19105* (2013.01); *H03F 2200/222* (2013.01); *H03F 2200/387* (2013.01); *H03F 2200/451* (2013.01)

(58) Field of Classification Search
USPC ...................... 330/302–307, 10, 251, 207 A
See application file for complete search history.

(56) References Cited

U.S. PATENT DOCUMENTS

| | | |
|---|---|---|
| 6,236,274 B1 | 5/2001 | Liu |
| 6,724,255 B2 | 4/2004 | Kee et al. |

(Continued)

OTHER PUBLICATIONS

Grebennikov, A.V., "Circuit Design Technique for High Efficiency Class F Amplifiers," Institute of Microelectronics (IME), 2000 IEEE MTT-S Digest, WE2C-1, p. 771-774.

(Continued)

*Primary Examiner* — Hieu P Nguyen

(57) ABSTRACT

The embodiments described herein provide radio frequency (RF) amplifiers, and in some embodiments provide amplifiers that can be used in high power RF applications. Specifically, the amplifiers described herein may be implemented with multiple resonant circuits to provide class F and inverse class F amplifiers and methods of operation. In general, the resonant circuits are implemented inside a device package with a transistor die to provide high efficiency amplification for a variety of applications.

19 Claims, 10 Drawing Sheets

(51) Int. Cl.
H03F 3/217 (2006.01)
H03F 3/193 (2006.01)

(56) References Cited

U.S. PATENT DOCUMENTS 6,879,209 B2 * 4/2005 Grundlingh .......... H03F 1/0294
330/207 A
9,503,025 B2 11/2016 Cao et al.
9,571,044 B1 2/2017 Zhu et al.
9,673,766 B1 6/2017 Roberts et al.

OTHER PUBLICATIONS

Zhu, N., U.S. Appl. No. 15/983,974 entitled, "Broadband Power Transistor Devices and Amplifiers and Methods of Manufacture Thereof," filed May 18, 2018.
Non Final Office Action; U.S. Appl. No. 16/226,341; 8 pages Mar. 4, 2020.

* cited by examiner

HIGH POWER RADIO FREQUENCY AMPLIFIERS AND METHODS OF MANUFACTURE THEREOF

TECHNICAL FIELD

Embodiments of the subject matter described herein relate generally to radio frequency (RF) amplifiers, and more particularly to broadband power transistor devices and amplifiers, and methods of manufacturing such devices and amplifiers.

BACKGROUND

Many systems employ power amplifiers for increasing the power of radio frequency (RF) signals. For example, in both radar and wireless communication systems high power RF amplifiers may form a portion of the last amplification stage in a transmission chain before provision of the amplified signal to an antenna for radiation over the air interface. High bandwidth, high gain, high linearity, stability, and a high level of power-added efficiency can be characteristics of a desirable high power RF amplifier in such systems.

In the past, high-power radio frequency amplifiers have commonly used silicon-based devices (e.g., laterally diffused metal oxide semiconductor (LDMOS). However, such silicon-based devices exhibit relatively low efficiencies and power densities when compared with the efficiencies and power densities of gallium nitride (GaN)-based power amplifier devices. Accordingly, GaN-based power amplifier devices have been increasingly considered for high power broadband applications. However, there are challenges to using GaN technology to achieve broadband power amplification (e.g., over 20 percent fractional bandwidth).

Thus, there remains a continuing need for improved amplifiers that can provide high power output at high frequencies and over a wide frequency bandwidth.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The embodiments described herein provide radio frequency (RF) amplifiers, and in some embodiments provide RF amplifiers that can be used in high power RF applications. The amplifiers described herein may be implemented to include one or more matching networks and one or more transistor encased together inside a device package. Specifically, the amplifiers can be implemented with at least one transistor and an output matching network packaged together, where the output matching network includes a plurality of resonant circuits configured to facilitate efficient amplifier operation at high frequencies and over wide bandwidths. For example, the plurality of resonant circuits in the output matching network can be implemented to facilitate class F or inverse class F amplifier operation. Additionally, the plurality of resonant circuits can also be implemented with other circuit elements to provide output impedance transformation in a way that facilitates efficient high power amplifier operation.

The plurality of resonant circuits in the output matching network can include inductive and capacitive elements that are implemented with bondwires and integrated passive devices (IPDs). In some such embodiments, the resonant circuits of the matching network can be fully implemented inside the package, and as such may provide the amplifier with high power, high frequency and/or wide bandwidth performance. Furthermore, in some embodiments these RF amplifier devices can be implemented with gallium nitride (GaN)-based transistors that can provide high efficiency and high power density. As such, the embodiments described herein can overcome the challenges to using GaN technology to achieve broadband power amplification (e.g., over 20 percent fractional bandwidth).

The embodiments described herein provide both class F amplifiers, inverse class F amplifiers, and methods of operation. So implemented, the class F and inverse class F amplifiers can be used to provide high efficiency amplification for a variety of applications, including radio frequency (RF) applications. A class F implementation will now be described with reference to FIGS. 1-10.

Figure 1:
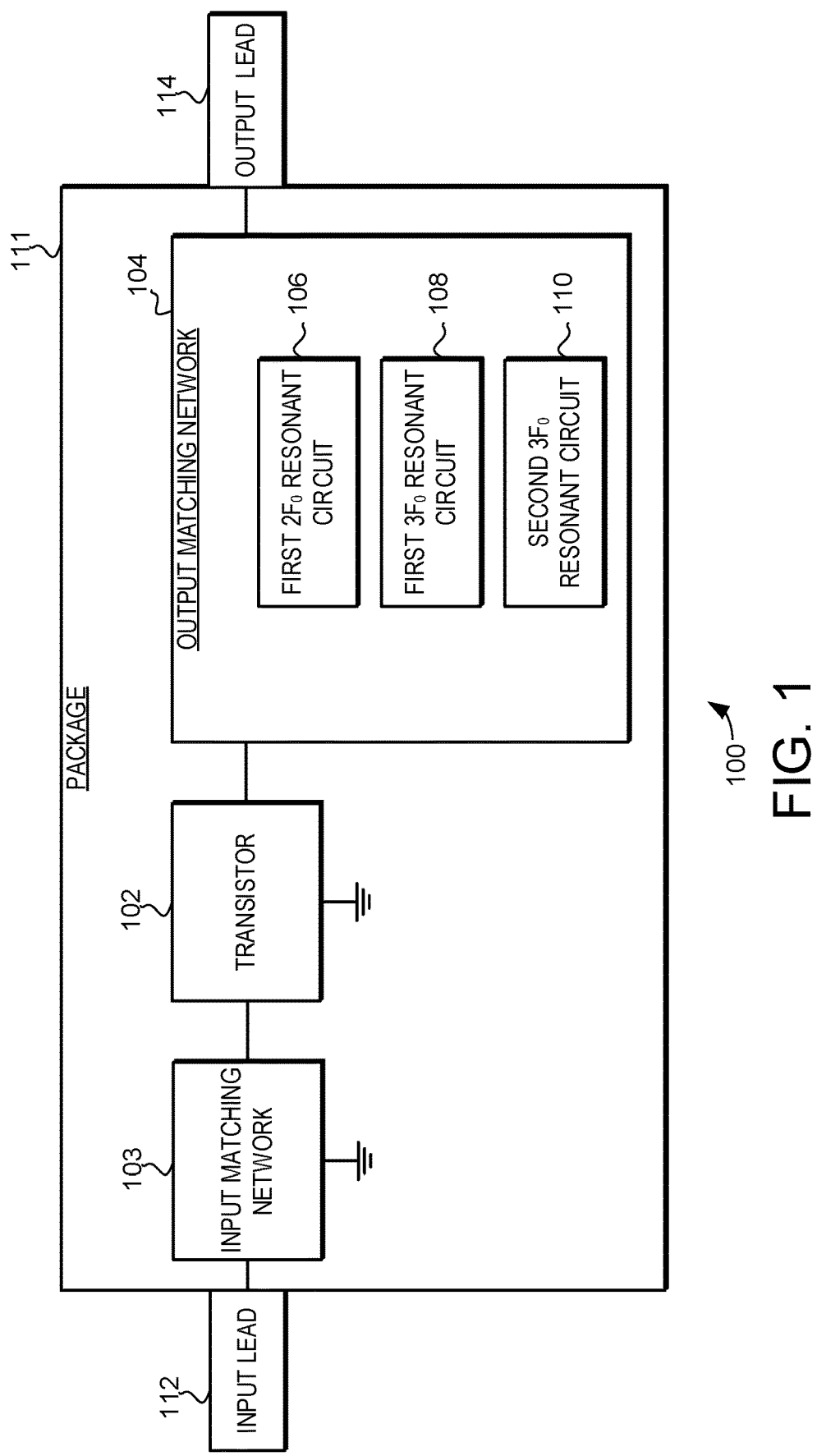
FIG. 1 is a schematic diagram of an amplifier device in accordance with an exemplary embodiment.

Turning now to FIG. 1, an exemplary class F amplifier 100 is illustrated schematically. In this embodiment, the amplifier 100 includes a first transistor 102, a first input matching network 103, a first output matching network 104, and a package 111 that includes a first input lead 112 and a first output lead 114. During operation, the amplifier 100 receives an input signal at a first input lead 112, and outputs an amplified signal through the output matching network 104 and the first output lead 114. The output amplified signal has signal energy at a fundamental frequency ($f_0$) and additional signal energy at multiple harmonic frequencies, including a second harmonic frequency of twice the fundamental frequency ($2f_0$) and a third harmonic frequency of three times the fundamental frequency ($3f_0$).

In accordance with the embodiments described herein, the output matching network 104 includes three resonant circuits: a first $2f_0$ resonant circuit 106, a first $3f_0$ resonant circuit 108, and a second $3f_0$ resonant circuit 110. In general, the first $2f_0$ resonant circuit 106 is configured to resonate at a second harmonic frequency ($2f_0$), and the first $3f_0$ resonant circuit 108 and the second $3f_0$ resonant circuit 110 are configured to resonate at a third harmonic frequency ($3f_0$). As will be described below, these three resonant circuits (106, 108 and 110) facilitate the operation of the amplifier 100 as an effective, high efficiency, class F amplifier.

As also will be described in greater detail below, the three resonant circuits (106, 108 and 110) in the output matching network 104 include inductive elements and capacitive elements. The various inductive elements may be implemented with IPDs and/or bondwires inside the device package 111. Likewise, the various capacitive elements may be implemented with IPDs inside the device package 111, and/or with discrete capacitors. Implementing the output matching network 104 with such components inside the device package 111 may facilitate improved high frequency performance in the amplifier 100, particularly in high power applications.

In typical implementations the transistor 102 is formed on a transistor die, and that transistor die typically includes a first input terminal (e.g., a gate control terminal), a first output terminal (e.g., a first current conducting terminal, such as a drain terminal), and a second output terminal (e.g., a second current conducting terminal, such as a source terminal) that are used to connect to the transistor 102. In one specific embodiment, the transistor 102 comprises a gallium nitride (GaN) field-effect transistor (FET), but other transistor types can also be used. As more specific examples, various III-V field effect transistors may be used (e.g., a high electron mobility transistor (HEMT)), such as a GaN FET (or another type of III-V transistor, including a gallium arsenide (GaAs) FET, a gallium phosphide (GaP) FET, an indium phosphide (InP) FET, or an indium antimonide (InSb) FET). In other examples the transistor 102 may be implemented with a III-V FET or with a silicon-based FET (e.g., a laterally-diffused metal oxide semiconductor (LD-MOS) FET).

Figure 2:
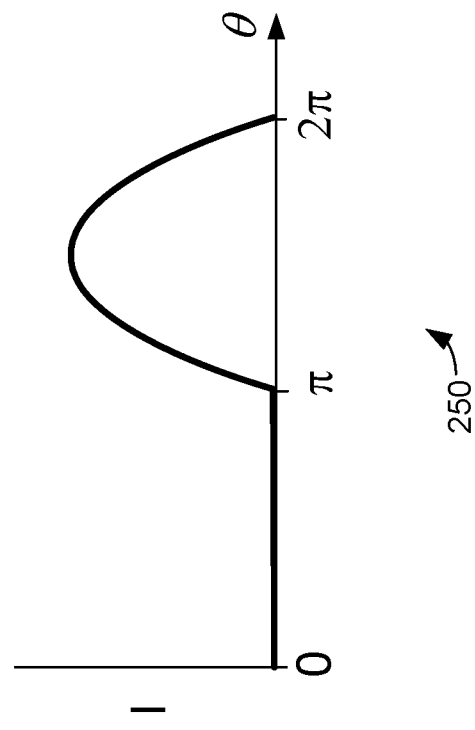
FIG. 2 is a graphical representation of a voltage waveform and current waveform in an exemplary class F amplifier.
Figure 2:
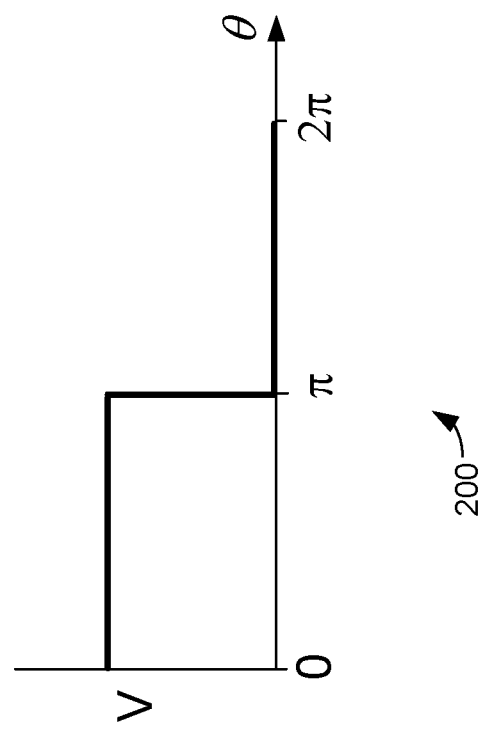

In general, class F amplifiers generate specific defined output voltage and current waveforms. These output waveforms minimize power consumption by reducing the portions of each cycle where current and voltage overlap. Turning to FIG. 2, a graph 200 illustrates an idealized output voltage and graph 250 illustrates an idealized output current for an exemplary class F amplifier (e.g., amplifier 100). As can be seen in FIG. 2, the output voltage is a square wave that is non-zero over the first half of the output cycle, and the output current is a half-sinusoid that is non-zero only over the second half of the output signal. When so implemented with substantially non-overlapping voltage and current output waveforms, power consumption is reduced, and a high efficiency class F amplifier is provided.

To generate such voltage and current waveforms and provide class F amplifier operation, the impedance presented at a transistor (e.g., transistor 102), as referenced to the current source in the transistor, should exhibit high impedance to frequencies at the odd harmonic frequencies and low impedance to frequencies at even harmonic frequencies. In particular, providing low impedance for signal energy at the second harmonic frequency is of particular importance, with diminishing importance for higher order even harmonic frequencies. Likewise, providing high impedance for signal energy at the third harmonic frequency is of particular importance, with diminishing importance for higher order odd harmonic frequencies. Thus for many applications, providing a low impedance (e.g., short circuit) for signal energy at the second harmonic frequency ($2f_0$) and providing a high impedance (e.g., open circuit) for signal energy at the third harmonic frequency ($3f_0$) can be sufficient to provide effective class F amplifier performance.

Returning to FIG. 1, the amplifier 100 is configured to provide high efficiency, class F operation through the use of the three resonant circuits (106, 108 and 110) in the output matching network 104. In general, the first $2f_0$ resonant circuit 106 is configured to resonate at a second harmonic frequency ($2f_0$), and the first $3f_0$ resonant circuit 108 and the second $3f_0$ resonant circuit 110 are configured to resonate at a third harmonic frequency ($3f_0$). Specifically, the first $2f_0$ resonant circuit 106 is configured to resonate at a second harmonic frequency ($2f_0$) and create a short circuit between the first output terminal and a ground for signal energy at the second harmonic frequency ($2f_0$). Likewise, the first $3f_0$ resonant circuit 108 is configured to resonate at a third harmonic frequency ($3f_0$) and create a short circuit between the first output lead 114 and the ground for signal energy at the third harmonic frequency ($3f_0$). Finally, the second $3f_0$ resonant circuit 110 is configured to resonate at the third harmonic frequency ($3f_0$) and create an open circuit between the first output terminal and the first output lead 114 for signal energy at the third harmonic frequency ($3f_0$).

Again, the first $3f_0$ resonant circuit 108 is configured create a short circuit between the first output lead 114 and the ground for signal energy at the third harmonic frequency ($3f_0$). It should be noted that this configuration is not typically found in a class F implementation, as class F amplifiers need high impedance (e.g., open circuit) at the output for signal energy at the third harmonic frequency ($3f_0$). However, in the embodiments described herein, the short circuit created by the first $3f_0$ resonant circuit 108 allows the second $3f_0$ resonant circuit 110 to be realized. Specifically, the second $3f_0$ resonant circuit 110 is only realized when the first $3f_0$ resonant circuit 108 resonates and generates a short circuit. Thus, the second $3f_0$ resonant circuit 110 is not in a form that will resonate at the third harmonic frequency ($3f_0$) without the simultaneous resonating of the first $3f_0$ resonant circuit 108. Stated another way, the second $3f_0$ resonant circuit 110 is dependent upon the resonating of the first $3f_0$ resonant circuit 108. Furthermore, when the second $3f_0$ resonant circuit 110 resonates it creates a high impedance or open circuit. Thus, when the first $3f_0$ resonant circuit 108 resonates, the second $3f_0$ resonant circuit 110 is realized and when also resonating creates the needed high impedance (e.g., open circuit) for signal energy at the third harmonic frequency ($3f_0$).

In one specific embodiment, the second $3f_0$ resonant circuit 110 is implemented in part with an inductance provided by a first bondwire array that is connected between a first output terminal of the transistor 102 and the first output lead 114. In such an embodiment, the first bondwire array provides the high power RF signal transmission path between the transistor 102 and the first output lead. As such, the first bondwire array is typically a relatively large bondwire array that can create a relatively large inductance.

Likewise, in one specific embodiment the first $3f_0$ resonant circuit 108 is implemented in part with an inductance provided by a second bondwire array that is connected between the first output lead and an IPD die. In such an embodiment the first $3f_0$ resonant circuit 108 is effectively implemented on the output lead side of the device, with the inductance provided by second bondwire array in a bond-back configuration from the output lead 114 to the IPD die. Implementing the first $3f_0$ resonant circuit 108 with the second bondwire array in a bond-back configuration, and implementing the second $3f_0$ resonant circuit 110 to include the first bondwire array providing the main connection between transistor 102 and the output lead 114 can provide distinct performance advantages. For example, such a configuration can facilitate class F operation using only bondwires as the inductive elements of the output matching network 104 rather than using additional integrated or discrete inductors. Using only bondwires to provide the inductances can minimize the overall amount of losses in the amplifier 100. Furthermore, such a configuration can provide a high impedance (e.g., open circuit) for signal energy at the third harmonic frequency ($3f_O$) at transistor output terminal, no matter what impedance is presented outside of the package.

In one embodiment that will be described in greater detail below, the second $3f_O$ resonant circuit 110 is implemented to include a first capacitance provided by the intrinsic output capacitance of the transistor 102, a first inductance provided by a first bondwire array, and the components of the first $2f_O$ resonant circuit. It should be noted that in such an embodiment the inclusion of the intrinsic output capacitance in the second $3f_O$ resonant circuit 110 can at least partially compensate for the generally adverse effects of that capacitance.

Specifically, the intrinsic output capacitance of a typical transistor (e.g., transistor 102) can allow a capacitive reactance path to ground for high frequency signal energy, including signal energy at the third harmonic frequency ($3f_O$). Such a capacitive reactance path would, if left uncompensated, provide a low impedance path for signal energy at third harmonic frequencies, and thus would prevent efficient class F operation. The embodiments described herein can overcome this by incorporating the intrinsic output capacitance into a second $3f_O$ resonant circuit in a way that eliminates the low impedance path that would otherwise exist for signal energy at the third harmonic frequency ($3f_O$).

In one embodiment, the output matching network 104 is implemented with a second bondwire array, the second bondwire array connected to the first output lead and a first capacitive element. In this embodiment, the second bondwire array provides a second inductance, the first capacitive element provides a second capacitance, and the first $3f_O$ resonant circuit includes the second inductance and the second capacitance. As one specific example, the second bondwire array can be arranged in bond-back configuration, connecting from the first output lead back to an IPD die inside the package 111.

In yet another embodiment, the output matching network 104 is further implemented with a third bondwire array, the third bondwire array connected to the first output terminal and a second capacitive element. In this embodiment the third bondwire array provides a third inductance, the second capacitive element provides a third capacitance, and the first $2f_O$ resonant circuit includes the third inductance and the third capacitance. In such embodiments both the second capacitive element and the third capacitive element can comprise IPDs formed on an IPD die. As one specific example, these capacitive elements can be implemented with one or more metal-insulator-metal (MIM) capacitors formed on an IPD die.

In yet another embodiment the output matching network 104 can further include a shunt inductive element and a shunt capacitive element connected to the first output terminal. And in some variations on this embodiment a video bandwidth circuit or baseband termination circuit can be coupled to a connection node between the shunt inductive element and the shunt capacitive element.

Next, it should be noted that in many applications the amplifier 100 can be implemented to include multiple transistors 102 in parallel, and that these multiple transistors 102 can be implemented in multiple parallel amplification paths. An example of such an implementation will be described in detail with reference to FIG. 7 below. In such embodiments each amplification path can include at least one transistor 102 and at least one output matching network 104, with each output matching network 104 including the resonant circuits 106, 108 and 110.

Finally, it should be noted that amplifier 100 is a simplified representation of a portion of an amplifier, and in a more typical implementation the amplifier 100 would include additional features not illustrated in FIG. 1. Also, as used herein, the term "package" means a collection of structural components (e.g., including a flange or other package substrate) to which the primary electrical components (e.g., input and output leads, transistor dies, IPD dies, and various electrical interconnections) are coupled and/or encased. The package 111 is thus a distinct device that may be mounted to a printed circuit board (PCB) or other substrate that includes other devices and portions of a circuit. As specific examples, the package 111 can comprise an air cavity or over-molded package having a suitable package substrate, input leads, and output leads.

Figure 3:
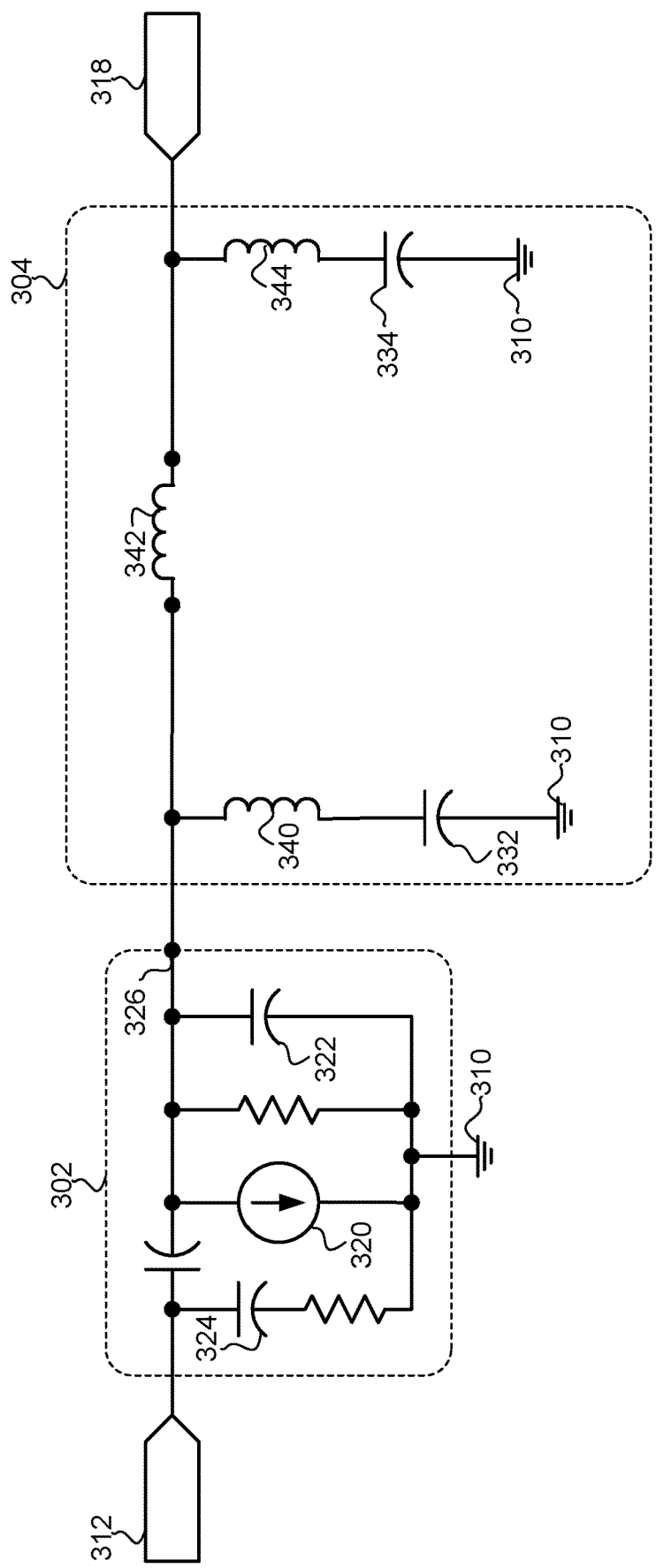
FIGS. 3-5 are circuit diagrams of amplifiers in accordance with various exemplary embodiments.

Turning now to FIG. 3, a circuit diagram representation of an exemplary amplifier 300 is illustrated. In this embodiment, the amplifier 300 again includes a transistor 302 and an output matching network 304. Note that an input matching network (e.g., input matching network 103) would also typically be included in amplifier 300, but is not illustrated in FIG. 3 for clarity. During operation, the amplifier 300 receives an input signal at an input terminal 312, and outputs an amplified signal through the output matching network 304 and the load terminal 318. In a typical packaged implementation the input terminal 312 would be coupled to an input lead (e.g., first input lead 112) and the load terminal 318 would be coupled to an output lead (e.g., first output lead 114). Also, in a typical RF application the amplified signal would have include significant signal energy at a fundamental frequency ($f_O$), and would include lesser signal energy at multiple harmonic frequencies, including signal energy at a second harmonic ($2f_O$) frequency and third harmonic ($3f_O$) frequency.

In FIG. 3 the transistor 302 is modelled as a current source 320 and associated resistances and capacitances. A control terminal (e.g., a gate) of the transistor 302 is coupled to the input terminal 312, a first transistor output terminal 326 or first current conducting terminal (e.g., a drain terminal) is coupled to the output matching network 304, and a second current conducting terminal (e.g., a source terminal) is coupled to a ground node (or another voltage reference). Included in this transistor model is an intrinsic input capacitance 324 and an intrinsic output capacitance 322. In a typical field-effect transistor implementation, the intrinsic output capacitance 322 would represent a drain-source capacitance commonly referred to as CDS. In a typical bipolar transistor, the intrinsic output capacitance 322 would be a collector-emitter capacitance commonly referred to as CCE.

It should be noted that at high frequencies such an intrinsic output capacitance 322 would normally provide a capacitive reactance path to ground that would prevent efficient class F operation. However, in the embodiments described herein, the intrinsic output capacitance 322 is selectively resonated with resonant circuits in output matching network 304 to block the path to ground 310 for signal energy at the third harmonic frequency ($3f_O$), and this facilitates class F amplifier operation.

In the embodiment illustrated in FIG. 3, the output matching network 304 is implemented with capacitive elements 332, 334 and with inductive elements 340, 342, 344. These various capacitive elements and inductive elements in the output matching network 304 are configured to provide three resonant circuits in the amplifier 300. Taken together, these three resonant circuits in the output matching network 304 facilitate the operation of the amplifier 300 as an effective, high efficiency, class F amplifier. Specifically, to generate the voltage and current waveforms needed for class F amplifier operation, these three resonant circuits are implemented to provide a low impedance path (e.g., short circuit) to ground at the transistor 302 for signal energy at the second harmonic frequency ($2f_O$) and to provide a high impedance path (e.g., open circuit) to ground for signal energy at the third harmonic frequency ($3f_O$).

Figure 4:
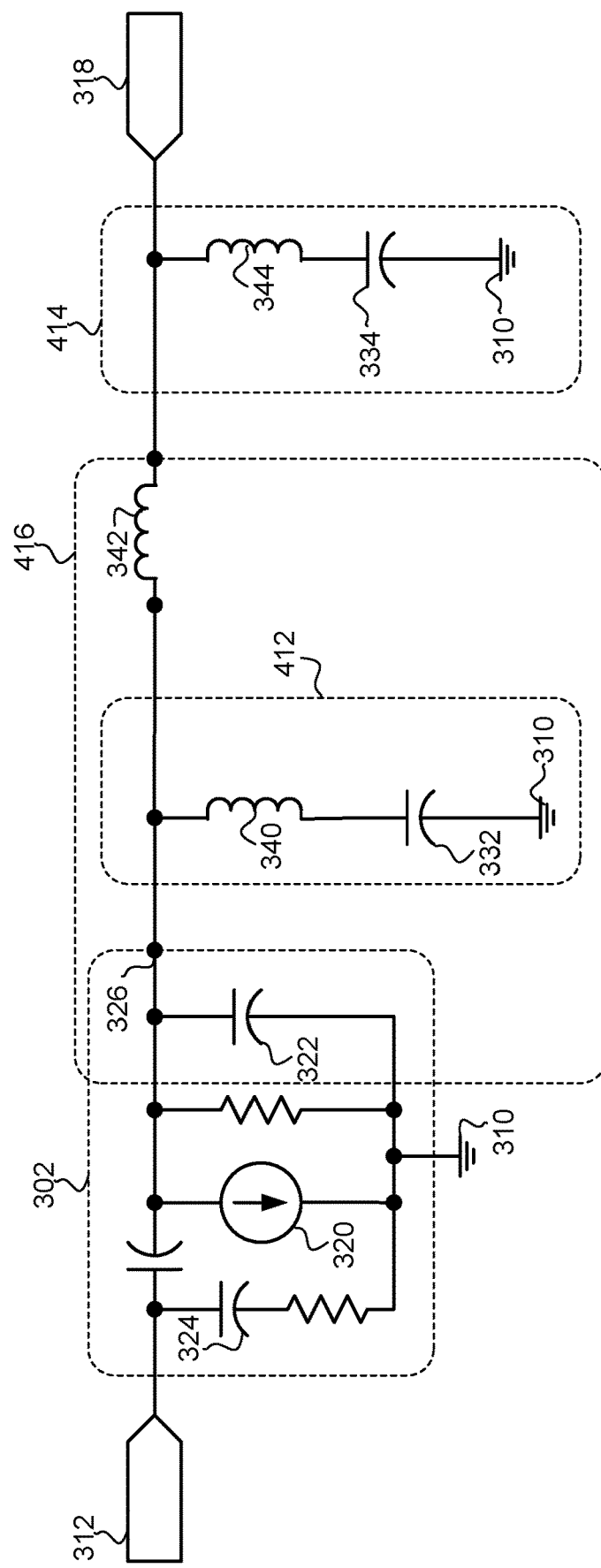

Turning now to FIG. 4, the exemplary class F amplifier 300 is again illustrated schematically. However, in this illustration the resonant circuits 412, 414 and 416 are individually identified and labelled. In general, the first $2f_O$ resonant circuit 412 is a series inductor-capacitor (LC) circuit implemented to resonate and provide a low impedance path (e.g., short circuit) to ground at the transistor 302 for signal energy at the second harmonic frequency ($2f_O$). Likewise, the first $3f_O$ resonant circuit 414 is a series LC circuit implemented to resonate and provide a low impedance path (e.g., short circuit) between the load terminal 318 and ground for signal energy at the third harmonic frequency ($3f_O$). Finally, the second $3f_O$ resonant circuit 416 is equivalent to a parallel LC circuit implemented to resonate and provide a high impedance path (e.g., open circuit) between the transistor 302 and ground for signal energy at the third harmonic frequency ($3f_O$). Taken together, these resonant circuits can thus generate the voltage and current waveforms needed for class F amplifier operation.

In the example of FIG. 4, the first $2f_O$ resonant circuit 412 includes capacitive element 332 and inductive element 340, and circuit 412 is configured to resonate at a second harmonic frequency ($2f_O$). The first $3f_O$ resonant circuit 414 includes capacitive element 334 and inductive element 344, and circuit 414 is configured to resonate at a third harmonic frequency ($3f_O$). Finally, the second $3f_O$ resonant circuit 416 includes intrinsic output capacitance 322, capacitive element 332 and inductive elements 340 and 342, and circuit 416 is configured to resonate at the third harmonic frequency ($3f_O$). Specifically, the first $2f_O$ resonant circuit 412 is configured to resonate at the second harmonic frequency ($2f_O$) and create a short circuit between the first transistor output terminal 326 and a ground for signal energy at the second harmonic frequency ($2f_O$). Likewise, the first $3f_O$ resonant circuit 414 is configured to resonate at a third harmonic frequency ($3f_O$) and create a short circuit between the load terminal 318 (and the associated output lead) and the ground for signal energy at the third harmonic frequency ($3f_O$). Finally, the second $3f_O$ resonant circuit 416 is configured to resonate at the third harmonic frequency ($3f_O$) and create an open circuit between the transistor 302 output and the load terminal 318 (and associated output lead) for signal energy at the third harmonic frequency ($3f_O$).

Furthermore, it should be noted that in this embodiment the second $3f_O$ resonant circuit 416 is dependent upon the resonating of at least the first $3f_O$ resonant circuit 414 to be realized. More specifically, the first $3f_O$ resonant circuit 414 is a series LC circuit (e.g., one or more inductors and capacitors in series) configured to resonate at $3f_O$. Series LC circuits provide low impedance paths (e.g., short circuit) when resonating. Thus, for signal energy at $3f_O$, the first $3f_O$ resonant circuit 414 resonates and provides a low impedance connection between the load terminal 318 and ground 310.

With the first $3f_O$ resonant circuit 414 resonating and providing a low impedance connection, the second $3f_O$ resonant circuit 416 is realized to be equivalent to a parallel LC circuit configured to resonate at $3f_O$. Specifically, with the first $3f_O$ resonant circuit 412 resonating and providing a short circuit, the intrinsic output capacitance 322, the inductive element 342 and the series combination of capacitive element 332 and inductive element 340 are then in parallel and form a parallel LC circuit configured to resonate at $3f_O$. Thus, for signal energy at $3f_O$, the second $3f_O$ resonant circuit 416 provides high impedance path (e.g., open circuit) between the transistor 302 output and ground 310.

Again, the first $3f_O$ resonant circuit 414 is a series LC circuit and thus is configured create a short circuit between the load terminal 318 (and the associated output lead) and the ground for signal energy at the third harmonic frequency ($3f_O$). It should again be noted that this configuration is not typically found in a class F implementation, as class F amplifiers need high impedance (e.g., open circuit) at the transistor 302 output for signal energy at the third harmonic frequency ($3f_O$). However, in this embodiment described herein, the short circuit created by the first $3f_O$ resonant circuit 414 allows the second $3f_O$ resonant circuit 416 to be realized. Specifically, the second $3f_O$ resonant circuit 416 is only realized when the first $3f_O$ resonant circuit 414 resonates and generates a short circuit path to ground. Thus, the second $3f_O$ resonant circuit 416 is not in a form that will resonate at the third harmonic frequency ($3f_O$) without the simultaneous resonating of the first $3f_O$ resonant circuit 414. Stated another way, the second $3f_O$ resonant circuit 416 is dependent upon the resonating of the first $3f_O$ resonant circuit 414. Furthermore, the second $3f_O$ resonant circuit 416 is a parallel LC circuit and when it resonates it creates high impedance or open circuit at the transistor 302 output. Thus, when the first $3f_O$ resonant circuit 414 resonates, the second $3f_O$ resonant circuit 416 is realized, and when circuit 416 also is resonating it creates the needed high impedance (e.g., open circuit) for signal energy at the third harmonic frequency ($3f_O$).

It should also be noted that in addition to facilitating class F operation, the resonating of the second $3f_O$ resonant circuit 416 also may effectively reduce the potentially negative effects of the intrinsic output capacitance 322. Specifically, the resonating of the second $3f_O$ resonant circuit 416 provides a high impedance path to ground 310, which blocks the current path through the intrinsic output capacitance 322 for signal energy at $3f_O$. Without such blocking, the intrinsic output capacitance 322 would provide a path to the ground 310 that can interfere with efficient amplifier operation.

As was described above, in various embodiments of amplifier 300 the various capacitive elements 332, 334 and inductive elements 340, 342, 344 are implemented inside the device package with the transistor 302. For examples, the various capacitive elements 332, 334 and inductive elements 340, 342, 344 may be implemented with integrated passive devices (IPDs), which comprise a semiconductor substrate with a passive device formed in built-up conductive and dielectric layers overlying the semiconductor substrate. In other embodiments, some of the capacitive and/or inductive elements may be implemented with discrete components. Furthermore, in some embodiments, some or all of the various inductive elements 340, 342, 344 may be implemented with bondwires inside the device package. In one specific embodiment that will be described in greater detail below, the inductive element 342 may be implemented by a first bondwire array that is connected between the first transistor output terminal 326 and an output lead. Likewise, the inductive element 344 may be implemented as a second bondwire array in a bond-back configuration, connecting from output lead back to a capacitor and/or an IPD die inside the package. Finally, in such an embodiment the capacitive elements 332 and 334 can be implemented on the IPD die inside the package. And again, implementing these capacitive elements 332, 334 and inductive elements 340, 342, 344 with such components inside the device package may facilitate improved high frequency performance in the amplifier 100, 300, particularly in high power applications.

Figure 5:
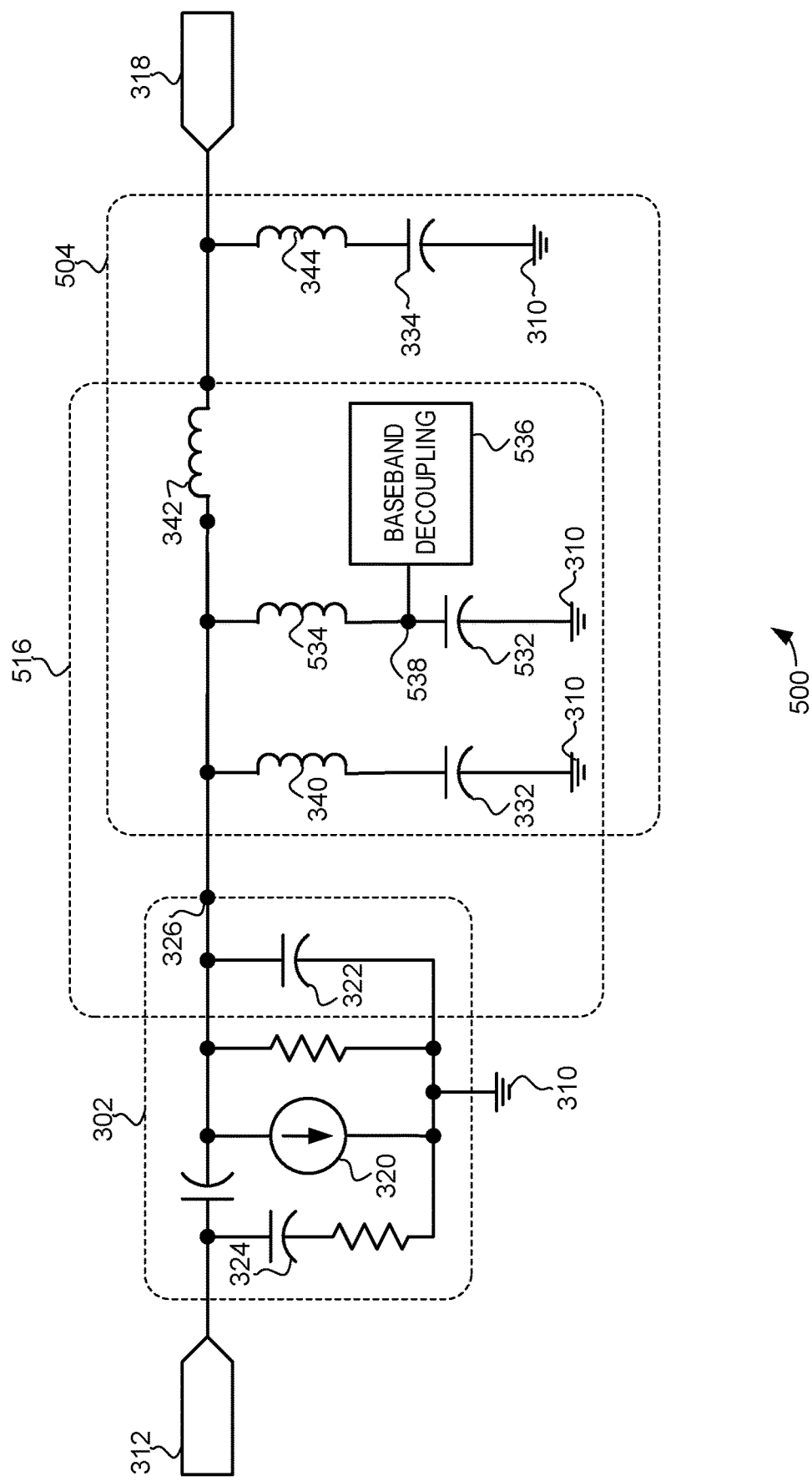

Turning now to FIG. 5, a circuit diagram representation of an exemplary amplifier 500 is illustrated. In this embodiment, the amplifier 500 again includes a transistor 302 and an output matching network 504. Note that an input matching network (e.g., input matching network 103) would also typically be included in amplifier 500, but is not illustrated in FIG. 5 for clarity. During operation, the amplifier 500 receives an input signal at an input terminal 312, and outputs an amplified signal through the output matching network 504 and to the load terminal 318. In a typical packaged implementation the input terminal 312 would be coupled to an input lead (e.g., first input lead 112) and the load terminal 318 would be coupled to an output lead (e.g., first output lead 114). Also, in a typical RF application the amplified signal would have significant signal energy at a fundamental frequency ($f_0$), and would include additional signal energy at multiple harmonic frequencies, including signal energy at a second harmonic ($2f_0$) frequency and third harmonic ($3f_0$) frequency.

The amplifier 500 includes capacitances and inductances that are configured to form three resonant circuits in the output matching network 504, which facilitates the operation of the amplifier 500 as an effective, high efficiency, class F amplifier. However, in this embodiment the second $3f_0$ resonant circuit 516 includes an additional capacitive element 532 and an additional inductive element 534. Thus, in this embodiment the second $3f_0$ resonant circuit 516 includes intrinsic output capacitance 322, capacitive elements 332, 532 and inductive elements 340, 342, 534 and is configured to resonate at the third harmonic frequency ($3f_0$). When so resonating the second $3f_0$ resonant circuit 516 is configured to create an open circuit between the transistor 302 output and the load terminal 318 (and associated output lead) for signal energy at the third harmonic frequency ($3f_0$).

In this embodiment the additional capacitive element 532 and an additional inductive element 534 are arranged in a shunt configuration. Thus, the capacitive element 532 provides a shunt capacitive element and the inductive element 534 provides a shunt inductive element. In general, this configuration of the capacitive element 532 and inductive element 523 can help provide an appropriate impedance transformation for signal energy at the fundamental frequency ($f_0$). Specifically, the capacitive element 532 can be implemented with relatively large capacitor that acts as a near short circuit for signal energy at the fundamental frequency ($f_0$). Thus, this signal energy sees only the shunt inductance provided by the inductive element 534. Accordingly, the combination of inductive element 534 and capacitive element 532 can be considered a high-pass matching circuit.

Furthermore, the node 538 between the inductive element 534 and capacitive element 532 provides a point of low impedance for RF signal energy. This RF low-impedance point at node 538 provides a coupling point for a baseband decoupling circuit 536 (sometimes referred to as a video bandwidth (VBW) circuit). In general, the baseband decoupling circuit 536 is coupled between the RF low impedance point and ground, and is implemented to provide a desired impedance response in the baseband frequency region below the fundamental frequency ($f_0$). At these low baseband frequencies the inductive element 534 essentially acts as a short circuit while the capacitive element 532 acts as an open circuit. Thus, at these low frequencies the transistor 302 essentially only sees the impedance provided by the baseband decoupling circuit 536. Thus, by implementing the baseband decoupling circuit 536, the desired impedance response in the baseband region can be provided. In one specific embodiment, the baseband decoupling circuit 536 is configured to improve the low frequency resonance (LFR) of the amplifier 500 caused by the interaction between the input or output impedance matching circuits and the bias feeds (not shown) by presenting a low impedance at envelope frequencies and/or a high impedance at RF frequencies. When properly implemented the baseband decoupling circuit 536 essentially may be considered to be "invisible" from an RF matching standpoint, as it primarily affects the impedance at the low baseband frequencies by providing low impedance terminations for signal energy at these frequencies. The baseband decoupling circuit 536 may have any of a number of different circuit configurations, in various embodiments.

Figure 6:
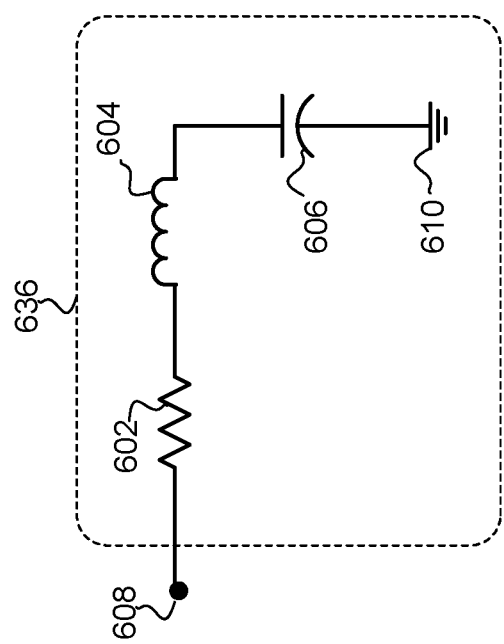
FIG. 6 is a circuit diagrams of a baseband decoupling circuit in accordance with various exemplary embodiments.

Turning now to FIG. 6, a circuit diagram of an exemplary baseband decoupling circuit 636 is illustrated. The baseband decoupling circuit 636 is one example of the type of circuit that can be used in amplifiers described herein. Thus, the baseband decoupling circuit 636 is an example of the type of circuit that can be used as the baseband decoupling circuit 536 in FIG. 5. The baseband decoupling circuit 636 includes a resistive element 602, an inductive element 604, and a capacitive element 606. In this illustrated example the resistive element 602, the inductive element 604, and the capacitive element 606 are coupled together in series between a node 608 and ground 610. In a typical embodiment the node 608 of the baseband decoupling circuit 636 would be connected to an RF low-impedance point (e.g., node 538 in FIG. 5) in the output matching network of the amplifier.

In this illustrated embodiment the resistive element 602, inductive element 604, and capacitive element 606 serve as an envelope resistance, envelope inductance and envelope capacitive element respectively. With the resistive element 602, inductive element 604, and capacitive element 606 so configured, the baseband decoupling circuit 636 can provide a desired impedance response in the baseband frequency region below the fundamental frequency ($f_0$). Specifically, at these low baseband frequencies, the baseband decoupling circuit 636 presents a relatively low impedance for signal energy at baseband (e.g., envelope) frequencies and a relatively high impedance for signal energy at RF frequencies.

As described above, in many embodiments the baseband decoupling circuit 636 would be implemented inside the device package, with the transistor (e.g., transistor 302) and the output matching network (e.g., output matching network 502). In such embodiments the resistive element 602, inductive element 604, and capacitive element 606 can be implemented with integrated devices on IPDs, discrete devices, bondwires, etc. A detailed example of such an implementation will be shown in FIG. 9.

Finally, it should be noted that baseband decoupling circuit 636 is just one example of the type of circuit that can be employed. For example, the order of the resistive element 602, inductive element 604, and capacitive element 606 in the series circuit can be changed in some other embodiments. In yet other embodiments "bypass" or "parallel" inductances, resistances, and capacitances can be added across some or all of the resistive element 602, inductive element 604, and capacitive element 606. A variety of specific exemplary video bandwidth circuits that could be used as baseband decoupling circuits can be found in U.S. patent application Ser. No. 15/983,974, entitled "Broadband Power Transistor Devices and Amplifiers and Methods of Manufacture Thereof", and filed on May 18, 2018, which is incorporated herein by reference.

Figure 7:
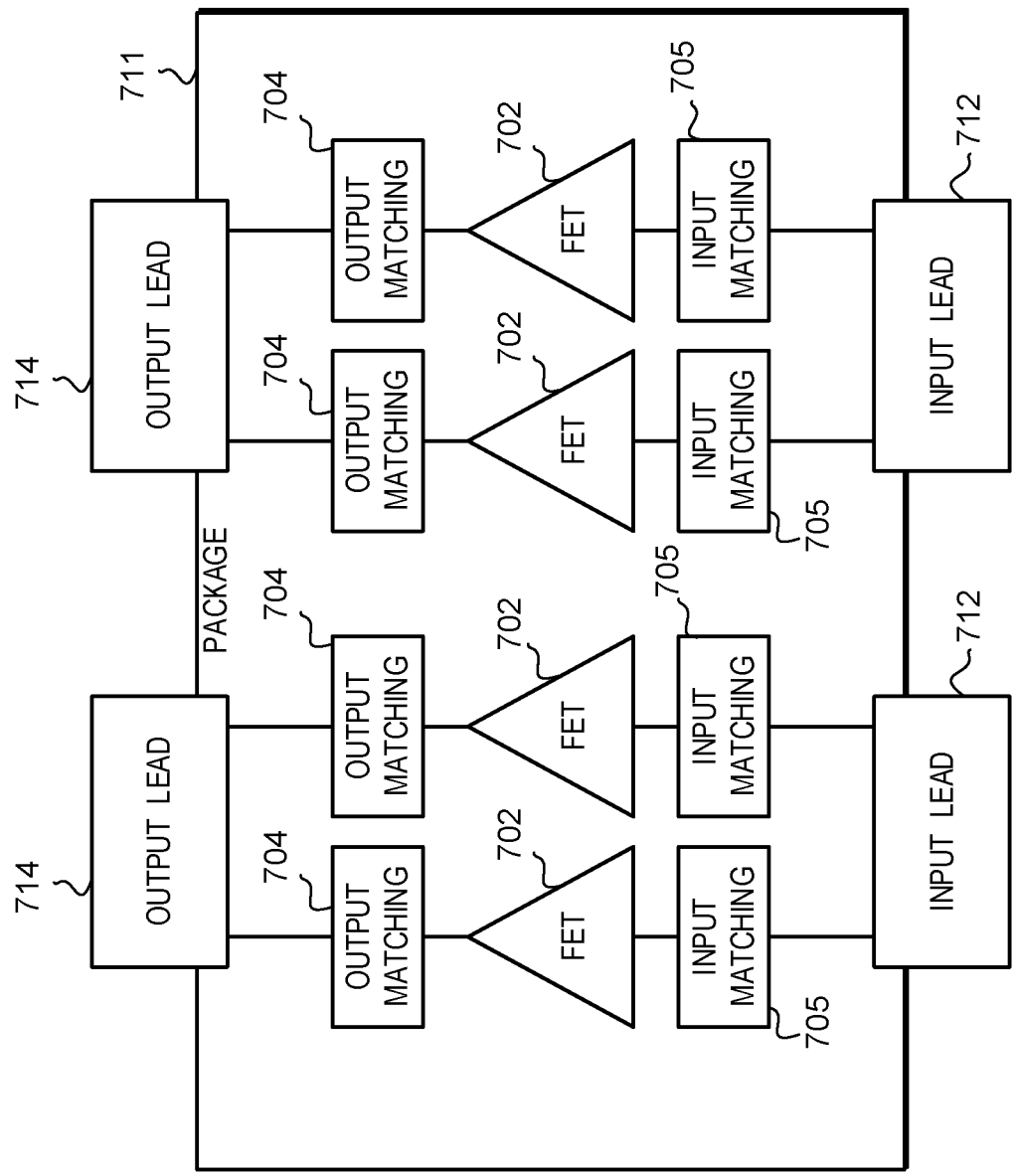
FIG. 7 is a schematic view of an RF power amplifier device that includes multiple parallel amplification paths in accordance with an example embodiment.

Turning now to FIG. 7, a schematic view of an amplifier 700 in accordance with an exemplary embodiment is illustrated. In this example, amplifier 700 includes a package 711, four field effect transistors (FETs) 702, four output matching networks 704, four input matching networks 705, two input leads 712, and two output leads 714. In this example, amplifier 700 implements two amplification paths, with each amplification path including two parallel input matching networks 705, two FETs 702, and two output matching networks 704, all encased together in one package 711. For example, the package 711 may include a package substrate (e.g., flange or other substrate with a conductive top surface that serves as a ground plane) to which the various FET dies and IPDs are connected, along with conductive leads that are electrically isolated from the substrate and electrically connected to the circuitry contained within the package 711. The package 711 may be an air-cavity package or a plastic encapsulated (overmolded) package.

In accordance with the embodiments described herein, output matching networks 704, are implemented to include a first $2f_0$ resonant circuit configured to resonate at a second harmonic frequency ($2f_0$), and first and second $3f_0$ resonant circuits configured to resonate at a third harmonic frequency ($3f_0$). And as was described above, each of the capacitive, inductive and resistive elements used to implement these resonant circuits can be implemented inside the package 711.

It should be noted that the amplifier 700 illustrated in FIG. 7 is just one example, and many other device implementations are possible. For example, other amplifiers can include more or fewer amplification paths, transistors, and matching networks.

Figure 8:
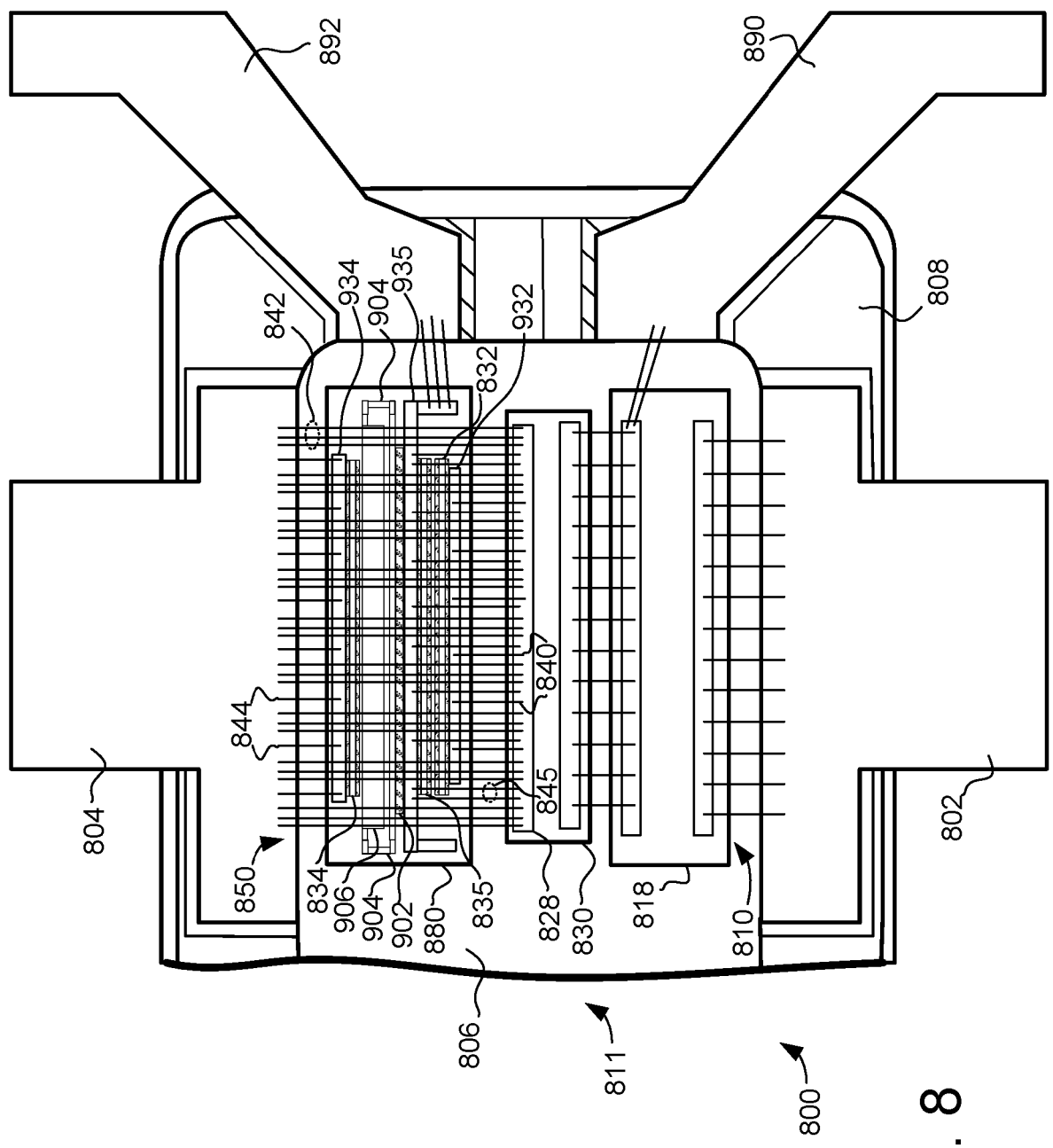
FIG. 8 is a top view of a portion of packaged RF power amplifier device in accordance with an example embodiment.
Figure 9:
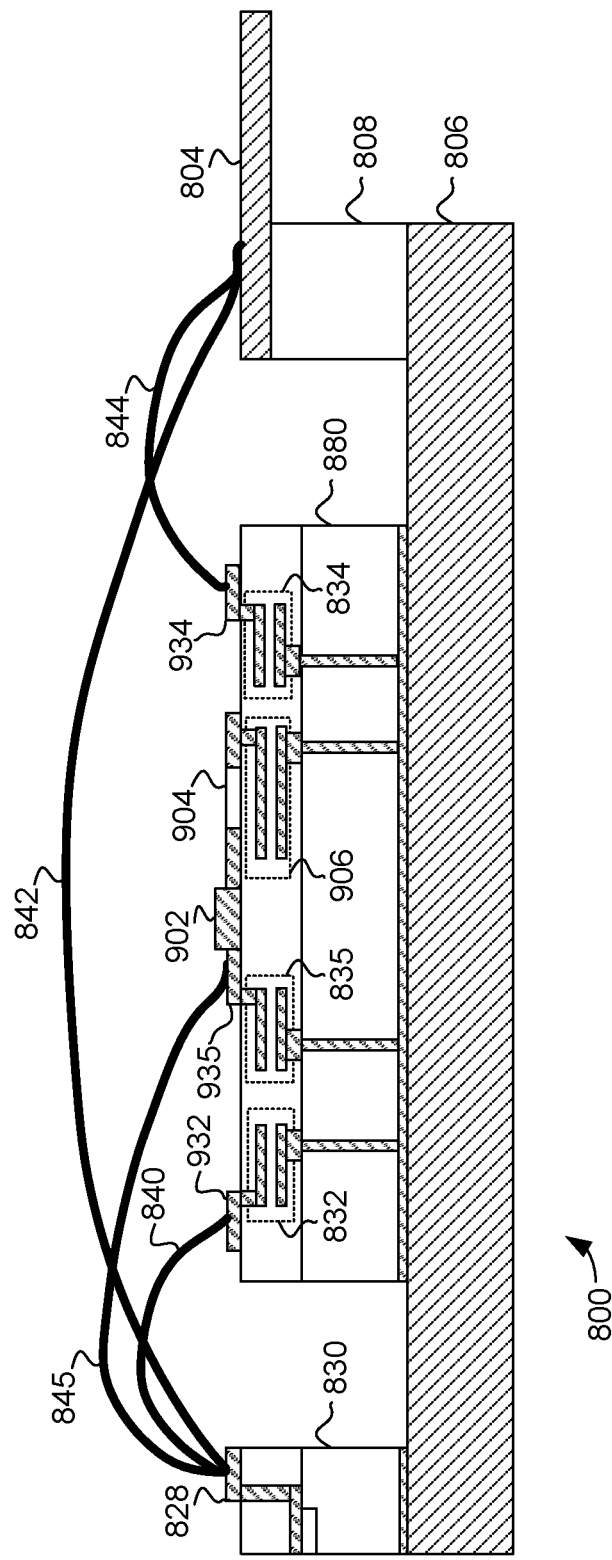
FIG. 9 is a cross-sectional side view of a portion of packaged RF power amplifier device in accordance with an example.

For example, FIG. 8 is a top view of an embodiment of a partial packaged RF amplifier device 800. For enhanced understanding, FIG. 8 should be viewed in conjunction with FIG. 9, which is a cross-sectional, side view of a portion of the amplifier device 800. Specifically, FIG. 9 shows a cross-sectional view through a portion of flange 806, transistor die 830, IPD assembly 880, and output lead 804.

The packaged RF amplifier device 800 embodies two parallel instances of a class F amplifier (e.g., amplifier 100, 300, 500) implemented in a package 811, although only one instance is shown in the partial top view of FIG. 8. As will be described in greater detail below, the amplifier device 800 includes an output side IPD assembly 880 and various bondwires which together implement an output matching network (e.g., output matching network 104, 304, 504).

The amplifier device 800 includes a flange 806 (or "device substrate") as part of the package 811. In one embodiment, the flange 806 includes a rigid electrically-conductive substrate with a thickness that is sufficient to provide structural support for various electrical components and elements of amplifier device 800. In addition, flange 806 may function as a heat sink for transistor die 830 and other devices mounted on flange 806. Flange 806 has top and bottom surfaces (only a central portion of the top surface is visible in FIG. 8), and a substantially-rectangular perimeter that corresponds to the perimeter of the amplifier device 800.

Flange 806 is formed from an electrically conductive material, and may be used to provide a ground reference node for the device 800 (e.g., providing ground 310, 610). For example, various components and elements may have terminals that are electrically coupled to flange 806, and flange 806 may be electrically coupled to a system ground when the device 800 is incorporated into a larger electrical system. At least the top surface of flange 806 is formed from a layer of conductive material, and possibly all of flange 806 is formed from bulk conductive material.

An isolation structure 808 is attached to the top surface of flange 806, in an embodiment. Isolation structure 808, which is formed from a rigid, electrically insulating material, provides electrical isolation between conductive features of the device (e.g., between leads 802 and 804 and flange 806). Isolation structure 808 has a frame shape, in an embodiment, which includes a substantially enclosed, four-sided structure with a central opening. Isolation structure 808 may have a substantially rectangular shape, as shown in FIG. 8, or isolation structure 808 may have another shape (e.g., annular ring, oval, and so on).

A portion of the top surface of flange 806 that is exposed through the opening in isolation structure 808 is referred to herein as the "active area" of device 800. Transistor die 830 is positioned within the active device area of device 800, along with IPD assemblies 818, and 880, which will be described in more detail later. For example, the transistor die 830 and the IPD assemblies 818 and 880 may be coupled to the top surface of flange 806 using conductive epoxy, solder, solder bumps, sintering, and/or eutectic bonds.

As noted above, the amplifier device 800 houses two amplifiers having two amplifier paths, although only one is illustrated in FIG. 8. The illustrated portion of the amplifier device 800 includes an input lead 802 and an output lead 804. The input lead 802 and the output lead 804 are mounted on a top surface of the isolation structure 808 on opposed sides of the central opening, and thus the input and output leads 802, 804 are elevated above the top surface of the flange 806, and are electrically isolated from the flange 806. Generally, the input and output leads 802, 804 are oriented to allow for attachment of bondwires between the input and output leads 802, 804 and components and elements within the central opening of isolation structure 808.

Transistor die 830 includes an integrated power FET, where the FET has a control terminal (e.g., a gate) and two current conducting terminals (e.g., a drain terminal and a source terminal), with one of those current conducting terminals configured as a transistor output terminal. A control terminal of a FET within the transistor die 830 is coupled through an input impedance matching circuit 810 to the input lead 802. In addition, one current conducting terminal (e.g., the drain terminal) of a FET within the transistor die 830 is coupled through the output matching circuit 850 to the output lead 804. The other current conducting terminal (e.g., the source) of a FET within the transistor die 830 is electrically coupled to the flange 806 (e.g., to ground), in an embodiment.

In addition to the input and output leads 802, 804, device 800 also may include bias leads 890, 892. Input-side bias lead 890 is typically electrically coupled through bondwires and other conductors to a control terminal of a FET within the transistor die 830. Likewise, output-side bias lead 892 is typically electrically coupled through bondwires and other conductors to a current conducting terminal or output terminal (e.g., the drain) of a FET within the transistor die 830. These bias leads 890 and 892 may be electrically coupled to external bias circuits (not shown) to provide bias voltages to the FET. In other embodiments, either or both the input-side or output-side bias leads 890 and 892 may be excluded.

According to one embodiment, the package 811 of the amplifier device 800 is an air cavity package, in which transistor die 830, IPD assemblies 880 and various other components are located within an enclosed air cavity. Basically, the air cavity is bounded by flange 806, isolation structure 808, and a cap (not shown) overlying and in contact with the isolation structure 808 and leads 802, 804, 890, 892. In other embodiments, the package 811 may include an overmolded package (i.e., a package in which the electrical components within the active device area are encapsulated with a non-conductive molding compound, and in which portions of the leads 802, 804, 890, 892 also may be encompassed by the molding compound). In such an overmolded package, isolation structure 808 may be excluded.

As noted above, the input impedance matching network is coupled between a control terminal (e.g., the gate) of the FET within the transistor die 830 and the input lead 802. Likewise, the output matching network 850 is coupled between a current conducting terminal (e.g., the drain terminal) of a FET within a transistor die 830 and the output lead 804. In accordance with the embodiments described herein, the output matching network 850 is implemented to include a first $2f_0$ resonant circuit configured to resonate at a second harmonic frequency ($2f_0$), and first and second $3f_0$ resonant circuits configured to resonate at a third harmonic frequency ($3f_0$). And as was described above, each of the capacitive, inductive and resistive elements used to implement these resonant circuits can be implemented inside the package 811.

Specifically, in the amplifier device 800 the output matching network 850 is implemented using capacitive elements 832, 834, 835 and with inductive elements 840, 842, 844, 845. In this illustrated example capacitive element 832 can correspond to capacitive element 332 of FIGS. 3, 4 and 5, capacitive element 834 can correspond to capacitive element 334 of FIGS. 3, 4 and 5, and capacitive element 835 can correspond to capacitive element 532 of FIG. 5. Likewise, inductive element 840 can correspond to inductive element 340 of FIGS. 3, 4 and 5, inductive element 842 can correspond to inductive element 342 of FIGS. 3, 4 and 5, inductive element 844 can correspond to inductive element 344 of FIGS. 3, 4 and 5, and inductive element 845 can correspond to inductive element 534 of FIG. 5. These various capacitances and inductances in the output matching network 850 are configured to provide three resonant circuits in the amplifier device 800. Taken together, these three resonant circuits in the output matching network 850 facilitates the operation of the amplifier device 800 as an effective, high efficiency, class F amplifier.

In the amplifier device 800 the capacitive elements 832, 834 and 835 are implemented with integrated capacitors on the output side IPD assembly 880. For example, the capacitive elements 832, 834 and 835 may be implemented as metal-insulator-metal (MIM) capacitors within the IPD assembly 880. In other embodiments, one or more of these capacitive elements may be implemented with a discrete capacitor, or a capacitor that is formed in another type of assembly (e.g., a low-temperature co-fired ceramic (LTCC) assembly).

In the amplifier device 800 the inductive elements 840, 842, 844, 845 are implemented with bondwires. Specifically, each inductive element 840, 842, 844, 845 is implemented with a plurality of generally parallel, closely-spaced sets of bondwires, generally referred to as a bondwire array. It should be noted that the number and arrangement of bondwires would be selected based on the power handling requirements and the desired inductances of the bondwires. Thus, for connections that require more power handling ability more bondwires can be provided.

In the example of FIG. 8, the inductive element 840 includes a plurality of bondwires coupled between a transistor output terminal 828 on the transistor die 830 and a bond pad terminal 932 that is electrically coupled to the capacitive element 832 on the IPD assembly 880. For clarity, only two of the bondwires of inductive element 840 are labeled in FIG. 8. However, it should be understood that inductive element 840 includes all bondwires coupled between the transistor output terminal 828 and the bond pad terminal 932 of the capacitive element 832. Likewise, the inductive element 842 includes a plurality of bondwires coupled between the transistor output terminal 828 on the transistor die 830 and the output lead 804 (again, for clarity only three of the bondwires of inductive element 842 are labeled in FIG. 8). Likewise, the inductive element 844 includes a plurality of bondwires coupled between the output lead 804 and a bond pad terminal 934 that is electrically coupled to capacitive element 834 on the IPD assembly 880 in a bond-back configuration (again, for clarity only two of the bondwires of inductive element 844 are labeled in FIG. 8). Finally, the inductive element 845 includes a plurality of bondwires coupled between the transistor output terminal 828 on the transistor die 830 and a bond pad terminal 935 that is electrically coupled to capacitive element 835 on the IPD assembly 880 (again, for clarity only two of the bondwires of inductive element 845 are labeled in FIG. 8).

It should be noted that in the example of FIG. 8 each the inductive elements in the three resonant circuits of the output matching network 850 are implemented with bondwires rather than using additional integrated or discrete inductors. Again, using only bondwires to provide the inductances of the resonant circuits can reduce the number of components used to implement the output matching network 850 and can thus minimize the overall amount of losses in the amplifier 800 and generally improve amplifier performance. In alternate embodiments, some portion of these inductive elements could be implemented using integrated inductors and/or discrete inductor devices.

FIG. 9 more clearly illustrates example embodiments of the capacitive elements 832, 834, 835 and inductive elements 840, 842, 844, 845 of the exemplary output matching network (e.g., output matching network 504). Again, the capacitive elements 832, 834 and 835 are implemented with integrated capacitors on the output side IPD assembly 880. For example, the capacitive elements 832, 834 and 835 may be implemented as metal-insulator-metal (MIM) capacitors within the IPD assembly 880.

In general, MIM capacitors are integrated capacitors formed from patterned conductive and dielectric layers on a semiconductor substrate. Portions of the conductive layers corresponding to electrodes are aligned with each other and separated (electrically and physically) from each other by dielectric layers. Specifically, the conductive electrodes are formed from patterned portions of the conductive layers of a build-up structure, where the build-up structure includes alternating dielectric and conductive layers. Each electrode may include a portion of a single conductive layer or multiple conductive layers, where the patterned portions of the conductive layers for a single electrode can be electrically connected using conductive vias, and the conductive layers for the two electrodes are interleaved with each other in an alternating arrangement. The amount of capacitance provided by a MIM capacitor can thus be determined by the patterned size and shape of the conductive layers (electrodes), the dielectric constant and thickness of the intervening dielectric layers, and the number of conductive layers electrically connected together to form each capacitor electrode. Furthermore, in a typical embodiment a number of MIM capacitors will be formed on an IPD assembly (e.g., IPD assembly 880) and a selected subset of those MIM capacitors can be electrically coupled together to provide a capacitive element with the desired capacitance value. Thus, some or all of the various capacitive elements 832, 834 and 835 can be implemented with one or more MIM capacitors electrically connected together to provide the desired capacitance value.

Alternatively, some or all of the capacitive elements 832, 834 and 835 may be implemented, for example, as discrete capacitors that are connected (e.g., using solder, a conductive epoxy, or other means) to a top surface of the IPD assembly 880. Although particular two-plate capacitor structures are shown in FIG. 9 for capacitive elements 832, 834 and 835, a variety of other capacitor structures alternatively may be utilized, as would be understood by one of skill in the art based on the description herein.

Also illustrated in FIGS. 8 and 9 are the elements of an exemplary baseband decoupling circuit (e.g., baseband decoupling circuit 536, 636). In this example, the baseband decoupling circuit includes an inductive element, a resistance, and a capacitance coupled together in series. Specifically, the baseband decoupling circuit includes an envelope resistor 902 (e.g., resistive element 602, FIG. 6), an envelope inductor 904 (e.g., inductive element 604, FIG. 6), and an envelope capacitor 906 (e.g., capacitive element 606, FIG. 6) electrically connected between an RF low-impedance point between inductive element 845 and capacitive element 835 and a ground reference (e.g., flange 806).

In this embodiment, the envelope resistor 902 is integrally formed as part of the IPD assembly 880. For example, each envelope resistor 902 may be a polysilicon resistor formed from a layer of polysilicon. In other alternate embodiments, the envelope resistor 902 may be formed from tungsten silicide or another material, may be a thick or thin film resistor, or may be a discrete component coupled to a top surface of IPD assembly 880.

In this embodiment, the envelope inductor 904 is also integrally formed as part of the IPD assembly 880. For example, the envelope inductor 904 may be a patterned conductor formed from portion(s) of one or more conductive layers of the build-up structure. In alternate embodiments, the envelope inductor 904 may be implemented as a plurality of bondwires, or as a spiral inductor (e.g., integrated within, on or proximate to the top surface of IPD assembly 880), or as a discrete inductor coupled to a top surface of IPD assembly 880.

In this embodiment, the envelope capacitor 906 is also integrally formed as part of the IPD assembly 880. Specifically, envelope capacitor 906 may be a MIM capacitor that is integrally formed with the IPD substrate of IPD assembly 880. In some embodiments, envelope capacitor 906 may be formed in the build-up structure entirely above the semiconductor substrate, or instead may have portions that extend into the semiconductor substrate or are otherwise coupled to, or in contact with, the semiconductor substrate. According to an embodiment, the envelope capacitor 906 may be formed from a first electrode, a second electrode, and a dielectric material between the first and second electrodes. The dielectric material of envelope capacitor 906 may include one or more layers of polysilicon, various oxides, a nitride, or other suitable materials. In various embodiments, the first and second electrodes of envelope capacitor 906 may include horizontal portions of conductive layers (e.g., portions that are parallel to the top and bottom surfaces of IPD assembly 880) and/or vertical portions (e.g., portions that are parallel to the sides of IPD assembly 880) of conductive layers that are interconnected. Further, the first and second electrodes of envelope capacitor 906 may be formed from metal layers and/or from conductive semiconductor materials (e.g., polysilicon). Alternatively, the envelope capacitor 906 may be, for example, a discrete capacitor that is connected (e.g., using solder, a conductive epoxy, or other means) to a top surface of the IPD assembly 880. Again, although a particular two-plate capacitor structure is shown in FIG. 9 for envelope capacitor 906, a variety of other capacitor structures alternatively may be utilized, as would be understood by one of skill in the art based on the description herein.

Figure 10:
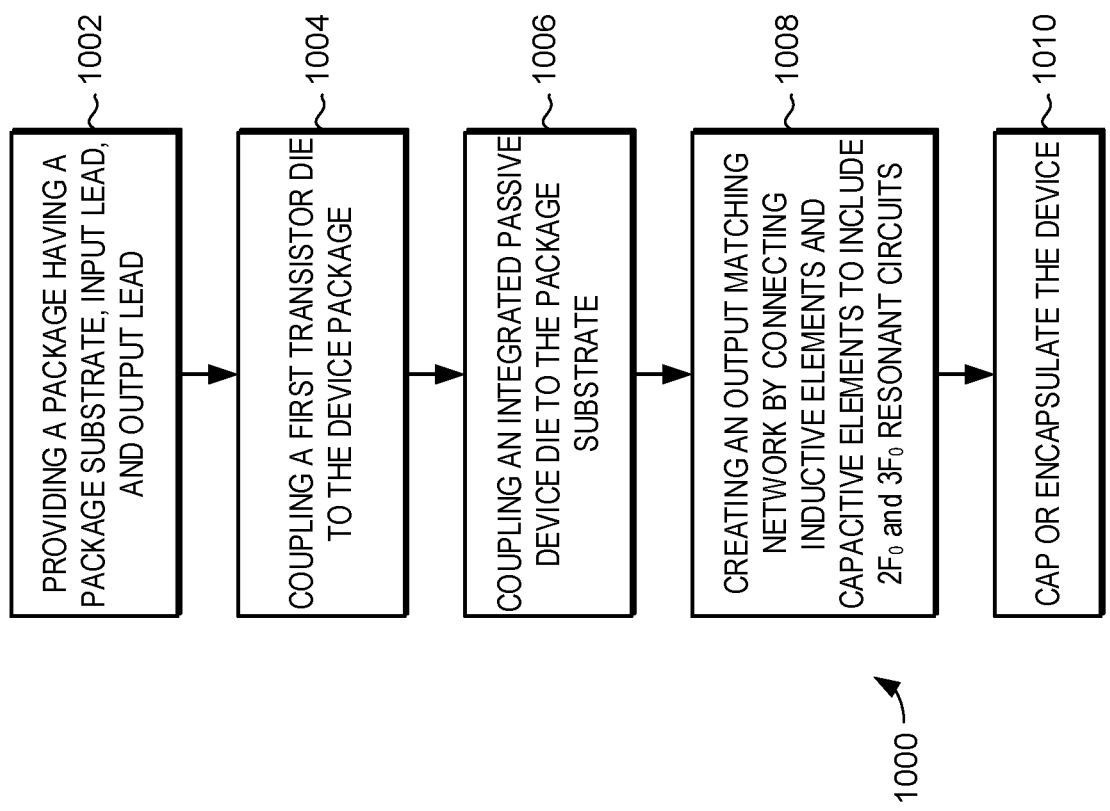
FIG. 10 is a flowchart of a method for fabricating a packaged RF power amplifier device in accordance with an example embodiment.

Turning now to FIG. 10, a flowchart illustrates a method 1000 for fabricating a packaged RF power amplifier device (e.g., class F amplifier 100, 300, 500, 700, 800, FIGS. 1, 3-5, 7-9) that includes an output matching network (e.g., output matching network 104, 304, 504, 704, 850). The output matching network is implemented to include three resonant circuits (e.g., a first $2f_0$ resonant circuit 106, a first $3f_0$ resonant circuit 108, and a second $3f_0$ resonant circuit 110). These three resonant circuits facilitate the operation of the amplifier as an effective, high efficiency, class F amplifier.

The output matching network is implemented to include inductive and capacitive elements that define these three resonant circuits elements. At least some of the inductive elements (e.g., inductive elements 340, 342, 344, 535, 840, 842, 844, 845) are implemented with bondwires while other inductive elements (e.g., inductive element 604, 904) may be implemented with bondwires, discrete inductors, or integrated inductors. Likewise, the capacitive elements (e.g., capacitive elements 332, 334, 532, 832, 834, 935, 906) are implemented with integrated capacitors, although some or all of the capacitive elements could be implemented with discrete capacitors. In such implementations the three resonant circuits in the output matching network can be fully implemented inside the package, and may provide the amplifier with good performance at relatively high frequencies and over a relatively wide bandwidth.

The method 1000 may begin, in block 1002, by providing a package having a package substrate, input lead, and output lead (e.g., package 811, flange 806, input lead 802, output lead 804). In block 1004 a first transistor die (e.g., transistor die 830 is coupled to the device package. This coupling can be accomplished by affixing the transistor die to package substrate (e.g., flange 806) using conductive epoxy, solder, solder bumps, sintering, and/or eutectic bonds, to give non-limiting examples.

In block 1006 an integrated passive device die (e.g., IPD assembly 880) is coupled to the device substrate between the transistor die and the output lead. As described above, the IPD die includes integrated passive devices, such as integrated MIM capacitors (e.g., capacitive elements 832, 834, 835, 906), integrated resistors (e.g., resistor 902), and integrated inductors (e.g., inductor 904).

In block 1008 an output matching network is created by connecting the inductive elements and capacitive elements. As described above, bondwires can be used to provide electrical connections between the integrated capacitive elements, the transistor, and the package leads. When so implemented, these bondwires also provide at least some of the inductive elements of the three resonant circuits (e.g., inductive elements 340, 342, 344, 534 of the resonant circuits 412, 414, 416, 516).

In block 1010 the device is capped (e.g., for an air cavity package) or encapsulated (e.g., with mold compound for an overmolded package). The resulting packaged amplifier device may then be incorporated into a larger electrical system.

It should be noted that the method 1000 can be expanded to also provide an input matching network (e.g., input matching network 103, 705) in the amplifier.

Taken together, the method 1000 can thus facilitate an implementation of an amplifier device with an output matching network that includes three or more resonant circuits. Taken together, these resonant circuits in the output matching network facilitate the operation of the amplifier as an effective, high efficiency, class F amplifier. Specifically, to generate the voltage and current waveforms needed for class F amplifier operation, the three resonant circuits are implemented to provide a low impedance (e.g., short circuit) at the transistor for signal energy at the second harmonic frequency ($2f_O$) and to provide a high impedance (e.g., open circuit) for signal energy at the third harmonic frequency ($3f_O$). Furthermore, the method 1000 allows these three resonant circuits to be fully implemented inside the device package, and as such may provide the amplifier with high frequency, wide bandwidth performance. Furthermore, in some embodiments these amplifier devices can be implemented with GaN-based transistors that can provide high efficiency and high power density.

In one embodiment a class F radio frequency (RF) amplifier configured to operate at a fundamental frequency ($f_O$) is provided, the class F RF amplifier comprising: a device package including at least a first output lead and a first input lead, the device package encasing: a first transistor die, wherein the first transistor die includes a first transistor, a first input terminal, and a first output terminal, the first transistor including an intrinsic output capacitance providing a first capacitance; and a first output matching network coupled between the first output terminal and the first output lead, the first output matching network including: a first bondwire array connected between the first output terminal and the first output lead, the first bondwire array providing a first inductance; a first $2f_O$ resonant circuit configured to resonate at a second harmonic frequency ($2f_O$) and create a short circuit between the first output terminal and a ground for signal energy at the second harmonic frequency ($2f_O$); a first $3f_O$ resonant circuit configured to resonate at a third harmonic frequency ($3f_O$) and create a short circuit between the first output lead and the ground for signal energy at the third harmonic frequency ($3f_O$); and wherein when the first $3f_O$ resonant circuit resonates, a second $3f_O$ resonant circuit is realized, where the second $3f_O$ resonant circuit includes the intrinsic output capacitance, the first inductance, and the first $2f_O$ resonant circuit, and wherein the second $3f_O$ resonant circuit is configured to resonate at the third harmonic frequency ($3f_O$) and create an open circuit.

In another embodiment a packaged class F radio frequency (RF) amplifier configured to operate at a fundamental frequency ($f_O$) is provided, the packaged class F RF amplifier comprising: a package substrate; a first input lead coupled to the package substrate; a first output lead coupled to the package substrate; a first transistor die coupled to the package substrate, wherein the first transistor die includes a first transistor, a first input terminal, and a first output terminal, and wherein the first transistor includes an intrinsic output capacitance providing a first capacitance; a first output matching network coupled between the first output terminal and the first output lead, the first output matching network including: a first integrated passive device (IPD) die coupled to the package substrate, the first IPD die including a first integrated capacitive element providing a second capacitance, and a second integrated capacitive element providing a third capacitance; a first bondwire array connected between the first output terminal and the first output lead, the first bondwire array providing a first inductance; a second bondwire array directly connected between the first output lead and the first IPD die, the second bondwire array providing a second inductance; a third bondwire array connected between the first output terminal and the first IPD die, the third bondwire array providing a third inductance; a first $2f_O$ resonant circuit configured to resonate at a second harmonic frequency ($2f_O$) and create a short circuit between the first output terminal and a ground for signal energy at the second harmonic frequency ($2f_O$), wherein the first $2f_O$ resonant circuit includes the third inductance in series with and the third capacitance; a first $3f_O$ resonant circuit configured to resonate at a third harmonic frequency ($3f_O$) and create a short circuit between the first output lead and the ground for signal energy at the third harmonic frequency ($3f_O$), wherein the first $3f_O$ resonant circuit includes the second inductance in series with the second capacitance; and wherein when the first $3f_O$ resonant circuit resonates, a second $3f_O$ resonant circuit is realized, where the second $3f_O$ resonant circuit includes the intrinsic output capacitance in parallel with the first inductance and in parallel with a combination of the third inductance in series with the third capacitance, and wherein the second $3f_O$ resonant circuit is configured to resonate at the third harmonic frequency ($3f_O$) and create an open circuit between the first output terminal and the first output lead for signal energy at the third harmonic frequency ($3f_O$).

In another embodiment a method of manufacturing a class F radio frequency (RF) amplifier device is provided, the method comprising the steps of: coupling a first input lead to a package substrate; coupling a first output lead to the package substrate; coupling a first transistor die to the package substrate, wherein the first transistor die includes a first transistor, a first input terminal, and a first output terminal, the first transistor including an intrinsic output capacitance providing a first capacitance; coupling an integrated passive device to the package substrate between the transistor die and the first output lead, wherein the integrated passive device includes one or more first integrally formed capacitors providing a second capacitance and one or more second integrally formed capacitors providing a third capacitance; and creating an output matching network coupled between the first output terminal and the first output lead by: connecting a first bondwire array between the first output terminal and the first output lead; connecting a second bondwire array between the first output lead and the integrated passive device, the second bondwire array providing a second inductance, such that a first $3f_O$ resonant circuit that includes the second inductance and the second capacitance is created, wherein the first $3f_O$ resonant circuit is configured to resonate at a third harmonic frequency ($3f_O$) and create an open circuit between the first output terminal and a ground for signal energy at the third harmonic frequency ($3f_O$); connecting a third bondwire array between the first output terminal and the integrated passive device, the third bondwire array providing a third inductance, such that a first $2f_O$ resonant circuit that includes the third inductance and the third capacitance is created, wherein the first $2f_O$ resonant circuit is configured to resonate at a second harmonic frequency ($2f_O$) and create a short circuit between the first output terminal and the ground for signal energy at the second harmonic frequency ($2f_O$); and wherein the first bondwire array provides a first inductance, and wherein the connecting of the first bondwire array between the first output terminal and the first output lead is such that when the first $3f_0$ resonant circuit resonates a second $3f_0$ resonant circuit is realized, where the second $3f_0$ resonant circuit includes the intrinsic output capacitance, the first inductance, and the first $2f_0$ resonant circuit, and wherein the second $3f_0$ resonant circuit is configured to resonate at the third harmonic frequency ($3f_0$) and create an open circuit between the first output terminal and the first output lead for signal energy at the third harmonic frequency ($3f_0$).

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A class F radio frequency (RF) amplifier configured to operate at a fundamental frequency ($f_0$), the class F RF amplifier comprising:
   a device package including at least a first output lead and a first input lead, the device package encasing:
      a first transistor die, wherein the first transistor die includes a first transistor, a first input terminal, and a first output terminal, the first transistor including an intrinsic output capacitance providing a first capacitance; and
      a first output matching network coupled between the first output terminal and the first output lead, the first output matching network including:
         a first bondwire array connected between the first output terminal and the first output lead, the first bondwire array providing a first inductance;
         a first $2f_0$ resonant circuit configured to resonate at a second harmonic frequency ($2f_0$) and create a short circuit between the first output terminal and a ground for signal energy at the second harmonic frequency ($2f_0$);
         a first $3f_0$ resonant circuit configured to resonate at a third harmonic frequency ($3f_0$) and create a short circuit between the first output lead and the ground for signal energy at the third harmonic frequency ($3f_0$); and
         a second bondwire array, the second bondwire array connected to the first output lead and a first capacitive element, the second bondwire array providing a second inductance, the first capacitive element providing a second capacitance, and wherein the first $3f_0$ resonant circuit includes the second inductance and the second capacitance,
      wherein when the first $3f_0$ resonant circuit resonates, a second $3f_0$ resonant circuit is realized, where the second $3f_0$ resonant circuit includes the intrinsic output capacitance, the first inductance, and the first $2f_0$ resonant circuit, and wherein the second $3f_0$ resonant circuit is configured to resonate at the third harmonic frequency ($3f_0$) and create an open circuit between the first output terminal and the first output lead for signal energy at the third harmonic frequency ($3f_0$).

2. The class F RF amplifier of claim 1, further comprising a third bondwire array, the third bondwire array connected to the first output terminal and a second capacitive element, the third bondwire array providing a third inductance, the second capacitive element providing a third capacitance, and wherein the first $2f_0$ resonant circuit includes the third inductance and the third capacitance.

3. The class F RF amplifier of claim 2, wherein the first capacitive element and the second capacitive element comprise integrated passive devices (IPDs) formed on an IPD die.

4. The class F RF amplifier of claim 1, wherein each bondwire in the first bondwire array includes a first end connected to the first output terminal and a second end connected to the first output lead.

5. The class F RF amplifier of claim 1, further comprising a shunt inductive element and a shunt capacitive element connected to the first output terminal.

6. The class F RF amplifier of claim 5, further comprising a baseband decoupling circuit coupled to a connection node between the shunt inductive element and the shunt capacitive element, wherein the baseband decoupling circuit includes a plurality of components.

7. The class F RF amplifier of claim 1, wherein the transistor comprises a gallium nitride (GaN) field-effect transistor (FET).

8. A packaged class F radio frequency (RF) amplifier configured to operate at a fundamental frequency ($f_0$), the packaged class F RF amplifier comprising:
- a package substrate;
- a first input lead coupled to the package substrate;
- a first output lead coupled to the package substrate;
- a first transistor die coupled to the package substrate, wherein the first transistor die includes a first transistor, a first input terminal, and a first output terminal, and wherein the first transistor includes an intrinsic output capacitance providing a first capacitance;
- a first output matching network coupled between the first output terminal and the first output lead, the first output matching network including:
  - a first integrated passive device (IPD) die coupled to the package substrate, the first IPD die including a first integrated capacitive element providing a second capacitance, and a second integrated capacitive element providing a third capacitance;
  - a first bondwire array connected between the first output terminal and the first output lead, the first bondwire array providing a first inductance;
  - a second bondwire array directly connected between the first output lead and the first IPD die, the second bondwire array providing a second inductance;
  - a third bondwire array connected between the first output terminal and the first IPD die, the third bondwire array providing a third inductance;
  - a first $2f_0$ resonant circuit configured to resonate at a second harmonic frequency ($2f_0$) and create a short circuit between the first output terminal and a ground for signal energy at the second harmonic frequency ($2f_0$), wherein the first $2f_0$ resonant circuit includes the third inductance in series with the third capacitance;
  - a first $3f_0$ resonant circuit configured to resonate at a third harmonic frequency ($3f_0$) and create a short circuit between the first output lead and the ground for signal energy at the third harmonic frequency ($3f_0$), wherein the first $3f_0$ resonant circuit includes the second inductance in series with the second capacitance; and
  - wherein when the first $3f_0$ resonant circuit resonates, a second $3f_0$ resonant circuit is realized, where the second $3f_0$ resonant circuit includes the intrinsic output capacitance in parallel with the first inductance and in parallel with a combination of the third inductance in series with the third capacitance, and wherein the second $3f_0$ resonant circuit is configured to resonate at the third harmonic frequency ($3f_0$) and create an open circuit between the first output terminal and the first output lead for signal energy at the third harmonic frequency ($3f_0$).

9. The packaged class F RF amplifier of claim 8, further comprising a shunt inductive element and a shunt capacitive element, wherein the shunt capacitive element includes a third integrated capacitive element on the IPD die, and wherein the shunt inductive element includes a fourth bondwire array connected between the first output terminal and the first IPD die.

10. The packaged class F amplifier of claim 9, further comprising a baseband decoupling circuit coupled to a connection node between the fourth bondwire array and the third integrated capacitive element.

11. The packaged class F RF amplifier of claim 8, wherein the transistor comprises a gallium nitride (GaN) field-effect transistor (FET).

12. A method of manufacturing a class F radio frequency (RF) amplifier device, the method comprising the steps of:
- coupling a first input lead to a package substrate;
- coupling a first output lead to the package substrate;
- coupling a first transistor die to the package substrate, wherein the first transistor die includes a first transistor, a first input terminal, and a first output terminal, the first transistor including an intrinsic output capacitance providing a first capacitance;
- coupling an integrated passive device to the package substrate between the transistor die and the first output lead, wherein the integrated passive device includes one or more first integrally formed capacitors providing a second capacitance and one or more second integrally formed capacitors providing a third capacitance; and
- creating an output matching network coupled between the first output terminal and the first output lead by:
  - connecting a first bondwire array between the first output terminal and the first output lead;
  - connecting a second bondwire array between the first output lead and the integrated passive device, the second bondwire array providing a second inductance, such that a first $3f_0$ resonant circuit that includes the second inductance and the second capacitance is created, wherein the first $3f_0$ resonant circuit is configured to resonate at a third harmonic frequency ($3f_0$) and create an open circuit between the first output terminal and a ground for signal energy at the third harmonic frequency ($3f_0$);
  - connecting a third bondwire array between the first output terminal and the integrated passive device, the third bondwire array providing a third inductance, such that a first $2f_0$ resonant circuit that includes the third inductance and the third capacitance is created, wherein the first $2f_0$ resonant circuit is configured to resonate at a second harmonic frequency ($2f_0$) and create a short circuit between the first output terminal and the ground for signal energy at the second harmonic frequency ($2f_0$); and
  - wherein the first bondwire array provides a first inductance, and wherein the connecting of the first bondwire array between the first output terminal and the first output lead is such that when the first $3f_0$ resonant circuit resonates a second $3f_0$ resonant circuit is realized, where the second $3f_0$ resonant circuit includes the intrinsic output capacitance, the first inductance, and the first $2f_0$ resonant circuit, and wherein the second $3f_0$ resonant circuit is configured to resonate at the third harmonic frequency ($3f_0$) and create an open circuit between the first output terminal and the first output lead for signal energy at the third harmonic frequency ($3f_0$).

13. The method of claim 12, further comprising connecting a second bondwire array between the first output lead and the one or more first integrally formed capacitors, the second bondwire array providing a second inductance, the one or more first integrally formed capacitors providing a second capacitance, and wherein the first $3f_0$ resonant circuit includes the second inductance and the second capacitance.

14. The method of claim 13, further connecting a third bondwire array between the first output terminal and the one or more second integrally formed capacitors, the third bondwire array providing a third inductance, the one or more second integrally formed capacitors providing a third capacitance, and wherein the first $2f_O$ resonant circuit includes the third inductance and the third capacitance.

15. The method of claim 14, wherein the second capacitive element and the third capacitive element comprise integrated passive devices (IPDs) formed on an IPD die.

16. The method of claim 12, wherein each bondwire in the first bondwire array includes a first end connected to the first output terminal and a second end connected to the first output lead.

17. The method of claim 12, further comprising providing shunt inductive element and a shunt capacitive element connected to the first output terminal.

18. The method of claim 17, further comprising providing a baseband decoupling circuit coupled to a connection node between the shunt inductive element and the shunt capacitive element.

19. The method of claim 12, wherein the transistor comprises a gallium nitride (GaN) field-effect transistor (FET).

\* \* \* \* \*